United States Patent [19]

Kostecki

[11] 4,270,080

[45] May 26, 1981

[54] AUTOMATIC BATTERY CHARGE APPARATUS AND METHOD

[75] Inventor: Raymond T. Kostecki, Glenview, Ill.

[73] Assignee: Sun Electric Corporation, Crystal Lake, Ill.

[21] Appl. No.: 969,299

[22] Filed: Dec. 14, 1978

[51] Int. Cl.³ .............................................. H02J 7/04
[52] U.S. Cl. ...................................... 320/24; 320/32; 320/39
[58] Field of Search .................................... 320/22-24, 320/39, 40, 31, 32, 19

[56] References Cited

U.S. PATENT DOCUMENTS

| | | | |
|---|---|---|---|
| 2,285,620 | 6/1942 | Sears | 320/24 |
| 3,382,425 | 5/1968 | Legatti | 320/32 |
| 3,483,461 | 12/1969 | Schaefer | 320/31 |
| 4,061,956 | 12/1977 | Brown et al. | 320/22 |

FOREIGN PATENT DOCUMENTS 1411560  10/1975  United Kingdom ...................... 320/24

Primary Examiner—Robert J. Hickey
Attorney, Agent, or Firm—Allegretti, Newitt, Witcoff & McAndrews

[57] ABSTRACT

An automatic apparatus and method for charging a storage battery from a source of electrical current. The charger includes a current control circuit for conducting regulated charging current through the battery in steps. A voltage monitoring circuit determines when the steps occur by monitoring battery voltage conditions. The steps are sequenced by a ring counter that varies the bias conditions on the current control circuit and voltage monitoring circuit as the steps occur.

28 Claims, 5 Drawing Figures

AUTOMATIC BATTERY CHARGE APPARATUS AND METHOD

BACKGROUND OF THE INVENTION

This invention relates to battery chargers, and more particularly, relates to techniques for charging lead-acid automotive-type batteries.

The most frequently used type of charger today is one in which an initially high current from a constant voltage source is allowed to decrease or taper downward as the battery's state of charge rises. This is the familiar "taper" charger. The battery is presumed by the operator to be properly charged when the downward tapering current attains some low level. But this low current level is greatly dependent upon battery size, condition, line voltage, as well as many other factors. In addition, many chargers have a multiple position switch and a timer which permit the operator to select the initial charging current level and charging time. If the initial current selected by the operator is high, then the final tapered current level will also be high. Under these conditions the operator may misjudge when a "proper" charge has been attained. Also, if the current selected by the operator is high and the charging time is made long, the battery may suffer irreversible damage due to over-heating and water loss and may even explode.

All lead-acid batteries consume water while being charged. The water is decomposed into its constituent gasses, hydrogen and oxygen, and is allowed to escape from the battery. This is normal and is not serious with the conventional or regular type of lead-acid battery because the water can easily be replaced. The newer "maintenance-free" batteries have a different construction and chemistry, and the amount of water lost per charge cycle is less. However, the cells of these batteries are sealed and are not accessible to the user. Thus, the water lost, even though it is less, cannot be replaced without destroying the seals. Also, the specific gravity of the electrolyte cannot be observed without destroying the seals (specific gravity is sometimes used as an indication of state of charge) and this indication of charge is unavailable from sealed, maintenance-free batteries. The sealed batteries are, therefore, more susceptible to errors of judgment then the conventional ones.

Taper chargers require frequent operator attention as well as judgment. If the attention is not always provided and the judgment is in error, the battery may be either insufficiently charged or damaged by overcharging.

SUMMARY OF THE INVENTION

It is the intent of the invention to provide a battery charger apparatus and a method of charging which are automatic, require a minimum of operator attention and require virtually no operator judgment.

Surprisingly, it has been discovered that a storage battery can be charged rapidly and safely by using a technique different from the method employed in conventional taper chargers. According to the preferred technique, charging current is conducted through the battery at a first predetermined level. The battery voltage condition is monitored in order to determine the point in time at which the charging current should be reduced. When the battery voltage condition reaches a first predetermined value, the charging current is reduced to a second predetermined level, thereby reducing the battery voltage condition. Charging continues at the second predetermined level until the battery voltage condition attains a second predetermined value, less than the first predetermined value. The charging current then is shut off or reduced to a trickle current. Preferably, the voltage condition is voltage amplitude, and the charging current at the first and second levels is regulated so that the current within the levels remains constant.

According to another feature of the invention, the charging apparatus is protected from incorrect battery polarity connections or from damage when the battery is being disconnected.

According to another feature, the initial current level can be boosted and unregulated.

Still another feature enables a battery to be checked for a sulphated condition.

Another feature of the invention enables the ratios of the first and second levels of charging current to be altered in order to optimize the charging of different voltages and types of batteries.

DESCRIPTION OF THE DRAWINGS

FIGS. 2a connects with FIG. 2 at the lines at the left hand and right hand edges of FIGS. 2 and 2a, respectively.

FIG. 3 is a modified electronic schematic diagram of a portion of the circuit shown in FIGS. 2 and 2a;

DESCRIPTION OF THE PREFERRED EMBODIMENT

Overall General Description

Figure 1:
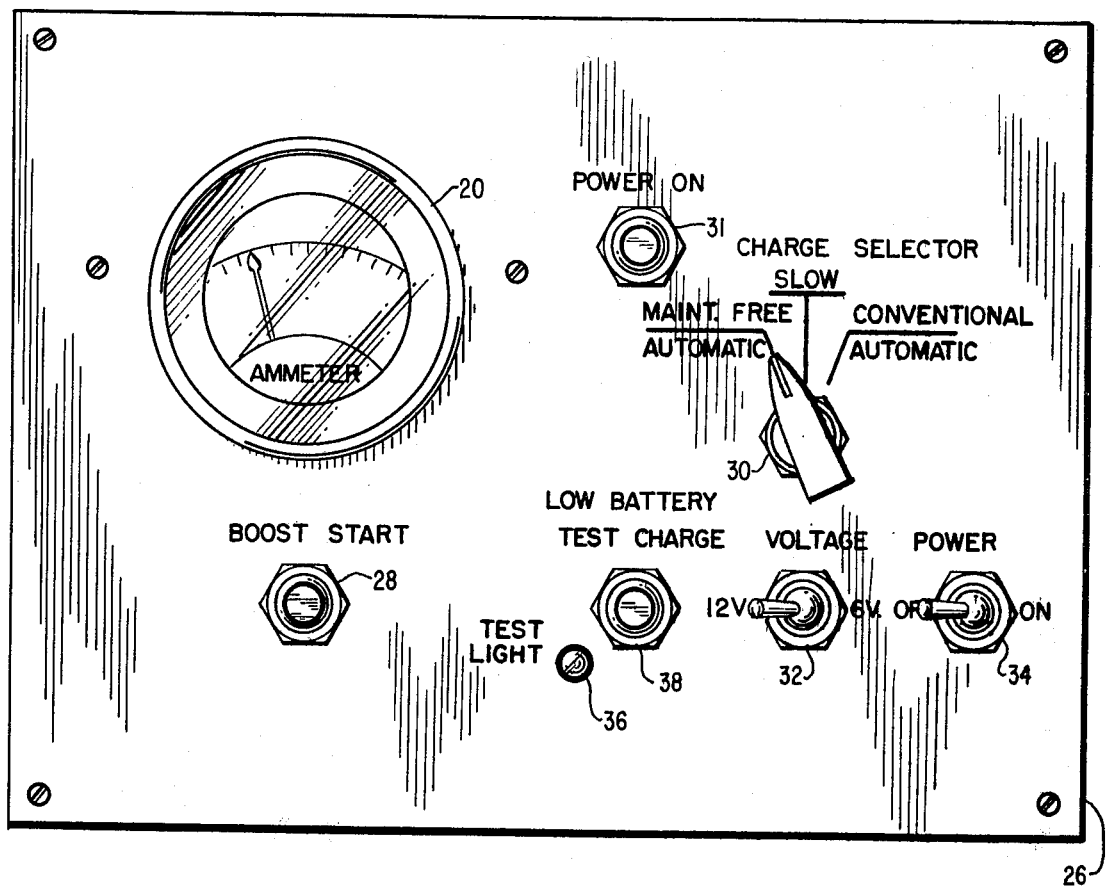
FIG. 1 is a view of the control panel utilized in connection with a preferred embodiment of the invention.

When properly connected to a battery and placed in operation, a charger made according to the preferred embodiment will deliver a high current to the battery in complete safety. The terminal voltage of the battery will gradually rise as the state of charge increases. When the state of charge is such that the voltage attains an initial voltage amplitude, the current is caused to step down to a lower first level and charging continues. When the voltage again rises to a first voltage amplitude lower than the initial voltage, the current is again stepped down to a lower second level. Charging continues until the voltage once more rises to a second voltage amplitude lower than the first, and the charger will then turn itself off.

Preferably, three different current levels are provided, in sequence, by three progressively decreasing battery voltages. However, the benefits of the invention can be enjoyed by using only two levels. The charging current in each of these steps or levels is regulated, and is reasonably independent of line voltage fluctuations and battery size or condition. This step-down of current is performed automatically, according to the battery's needs. The operator can neither induce a step-down of current nor withhold it from occurring.

When the unit cycles through its current steps and attains the "off" state, it will remain off and will not become operative when connections to the battery are broken or made. Sparking at the battery terminals thus does not occur. Sparking could be dangerous in the explosive hydrogen-oxygen gas mixture which may surround the battery. The charger can only be made operative again by some means such as cycling the flow of primary power.

If the charger is not connected to a battery and is energized, it will not become operative. Thus, shorting the output leads together will not produce sparking. Similarly, if the output leads are reverse-polarity connected to a battery, plus to minus and minus to plus, the unit cannot be made operative. It can remain in this condition indefinitely without harm to itself or the battery.

The charger must be assured that all is well before it will consent to do its work.

Maintenance-free batteries charge to a somewhat different terminal voltage than conventional or regular batteries. The charger is programmed accordingly for each type by means of a multiple position charge selector switch at the control panel (FIG. 1); the switch positions are identified as to the type of battery to be charged.

At the end of its stepping cycle, when the unit has turned itself off, it is sometimes desirable to continue charging the battery for a time with a small "trickle" current. Selector switch 30 is then placed in a position marked "Slow" to obtain this current. The trickle or slow current is regulated, as are the other current levels, and will remain at a nearly fixed level indefinitely. Since it will not taper downward, some other indication of a high state of charge must be provided.

The indication is accomplished by a test light 36 at the control panel (FIG. 1) which begins to flash on and off when the battery voltage has increased to a prescribed level during the slow charge step. When the flashing is observed, the operator is advised to turn off the charger and remove the battery. (This light will flash on once when the charger is turned on. Failure to do so indicates that the connections to the battery have been reversed).

Light 36 serves also to indicate that a three-minute timer has been activated by depressing a Low Battery and Test Charge button 38 (FIG. 1). The timer is an integral part of the charger. When activated, the timer serves to withhold current stepping for approximately three minutes; this is used as a check for a possibly sulphated condition of a battery. At the end of the three minute interval, the charger resumes its current stepping type of performance.

The charger is inoperative unless properly connected to a battery. This is accomplished by sensing battery voltage, of the proper polarity, and using this voltage to enable the charger's control circuitry. If this voltage is very low, as when the battery is well discharged, the control circuitry may not be activated and the charger is inoperative. To place the charger in operation, a voltage higher than that of the battery (available from within the charger) is substituted for the battery, and the charge cycle starts. This is accomplished by depressing Low Voltage Start and Battery Test button 38. Once started, charging will continue after the button is released because the charger will quickly increase the battery voltage above the minimum required for self-sustaining operation. However, it has been observed that for some batteries which are extremely "dead", the voltage at the start of charging will quickly rise to a level above that required for current stepping and fall again. This may occur several times in a minute or less.

If the charger shut itself off when the high voltage were attained, it would need to be re-activated a number of times until the voltage stabilized. This would be time-consuming and a source of annoyance.

For this reason, the three minute timer is activated when button 38 is depressed; current stepping is withheld, voltage becomes stabilized well within the three minute interval and normal charging resumes after the time expires. Thus, button 38 usually needs to be depressed only once.

Button 38 does not defeat the charger's protection from a reverse-connection to the battery. If connections are incorrect, the unit will refuse to operate no matter how many times the button is depressed, even if it is held down indefinitely.

It is sometimes desirable to start an automotive engine when the battery is incapable of delivering sufficient current for the vehicle's starting system. The charger described can deliver a current greatly in excess of its normal rating when a Boost Start button 28 (FIG. 1) is depressed. This defeats the current regulation type of performance, and the charging current is then dependent upon the load (i.e., the battery). A charging current upper limit is imposed for protection of the charger's internal components. The high boost current can be delivered until a circuit breaker within the charger opens. When the circuit breaker is reset, the charger will return to its normal regulation and current stepping mode of performance, even against the operator's wishes; the charger has a preference for this mode in order to protect itself and the battery from excessive currents.

Boost Start button 28 is depressed momentarily to secure the high boost current output. It need not be held down. It is effective only in the first of the three current steps, because in lower current stages, the peak currents passing through the charger's internal components may be excessive for these parts.

The charging current is stepped down each time the battery voltage attains a prescribed battery voltage threshold, as stated earlier. The three voltage levels required for stepping down are made progressively lower each time, for the following reasons. It is known that a high current and a low state of charge produce very little gassing, caused by the decomposition of water, and consequently little water is lost. Conversely, a high state of charge and a low current produce considerable gassing and a greater amount of water is lost. Thus, in the initial high current stage where the state of charge is low, the charging time is made relatively long because little water is consumed. To conserve water as the state of charge rises, the charging time in succeeding current steps is made progressively shorter. This is done by reducing the battery voltage threshold required for each step-down of current to occur. Thus, the progressively lower voltages required for current stepping also reduce the total charging time.

The threshold voltages are also made successively lower as current is reduced to allow for the voltage lost in the charger's output lead resistance, because voltage is sensed at the charger end and not at the battery, so as to conserve cost. The relative charging time in each current state is such as to yield the lowest amount of water lost and temperature rise consistent with a reasonably short total charging time. Of this total time, 70% to 85% is in the first high current stage. The second or intermediate current stage is slightly longer than the third low current stage, but these two can be made approximately equal for all practical purposes.

The battery charger described herein utilizes primarily electronic circuitry and has been designed to operate with six or twelve volt lead-acid automotive storage batteries of the conventional or regular type, as well as with the newer sealed maintenance-free type. However, the charger is not necessarily confined for use with these specific types of batteries. It is automatic in its performance or method of charging, and it senses the battery's needs automatically and adjusts itself accordingly. It provides for a boost start and also for a trickle charge after automatically stepping the charging current down a number of times. It also provides for starting the charging of a very low battery and quickly advises the operator, by application of a test charge, if the battery is incapable of being properly recharged. Indications are given by light 36 of various conditions and functions of the charger.

General Circuit Description

Figure 2:
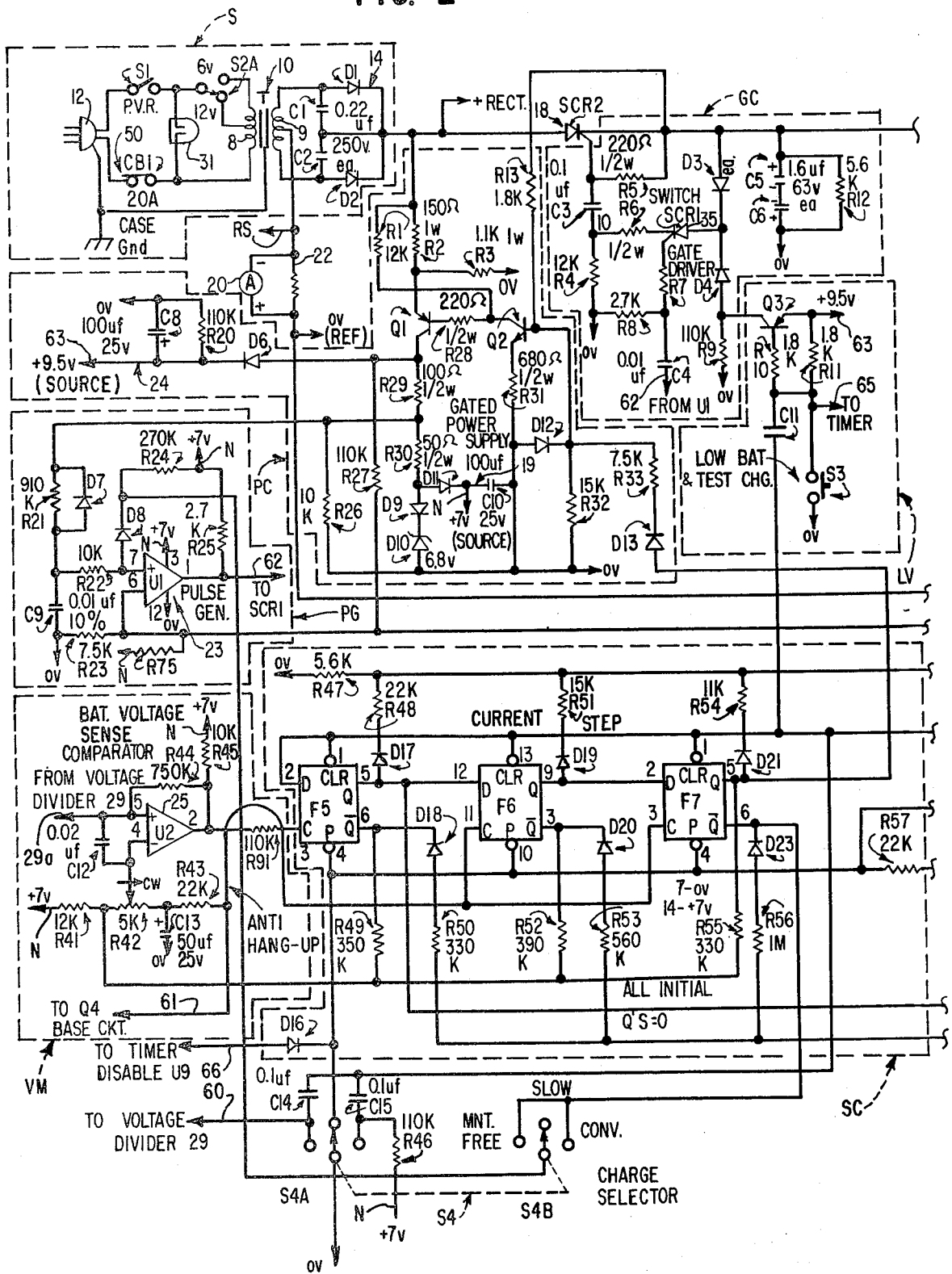
FIGS. 2 and 2a are electrical schematic diagrams of a preferred form of electronic circuit made in accordance with the invention.

Referring to FIG. 2, a source S of fluctuating dc current for a battery 16 comprises a step-down transformer 10 connected to a source of 110 volt AC current 12 and a conventional full-wave rectifier 14. Power on lamp 31 indicates that the charger is operating. Current from rectifier 14 passes through an electronic switch, such as a silicon controlled rectifier (SCR2) 18 and is delivered to battery 16. Charging current magnitude through battery 16, as indicated by a DC ammeter 20 on a control panel 26 (FIG. 1), is a function of the SCR2 conduction angle. When SCR2 is gated on early in the half-sinusoid voltage waveform emerging from the transformer-rectifier 10, 14, a high charging current will be indicated by ammeter 20. If SCR2 is gated on later in the voltage waveform, ammeter 20 will indicate a lower charging current.

Battery voltage, as sensed at the charger, is applied to a voltage monitor circuit VM. A reference voltage is also supplied to VM. When the battery voltage attains a prescribed threshold amplitude, circuit VM enables the reduction of the SCR2 conduction angle, and a lower charging current is indicated by ammeter 20.

In the third current level, when the battery voltage again attains a prescribed threshold, circuit VM enables the charger to shut off SCR2 completely.

Figure 2A:
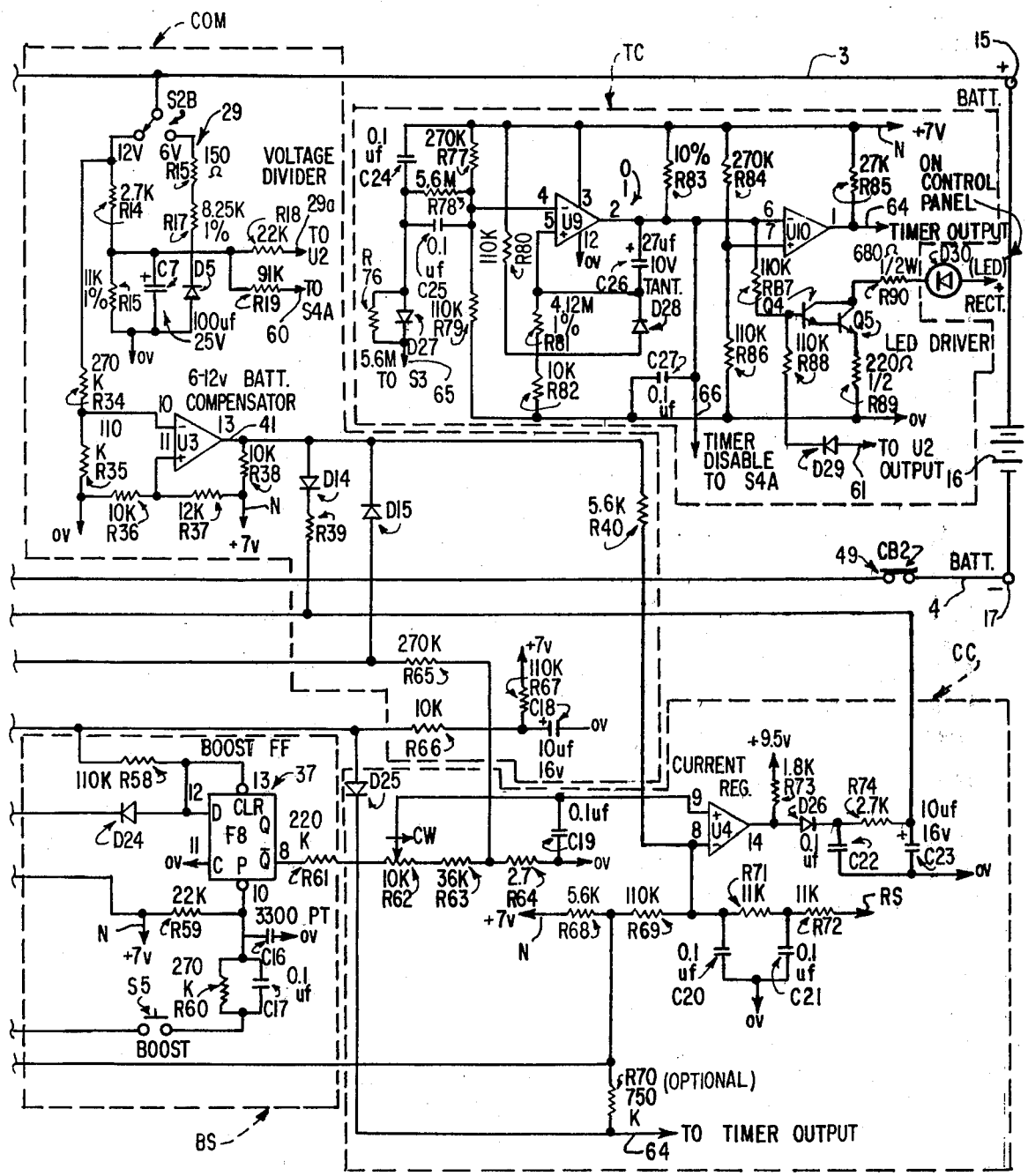

Ammeter 20 employs a current shunt 22. Signal potentials across the current shunt 22 are smoothed to remove high frequency components, which are present because of the manner in which SCR2 operates, and are applied to a current comparator circuit CC which enables regulation of the charging current in each step (FIG. 2a). Circuit CC is supplied with another voltage reference which determines the level of current to be regulated. The current magnitude at each step is determined and regulated by adjustment of this voltage reference.

For the Boost Start capability, the voltage reference is removed from circuit CC and current regulation is defeated. If the three minute timer becomes activated, the voltage reference is quickly restored to circuit CC, and current regulation is again obtained, but current stepping during this interval is withheld.

Power for the electronic circuitry is derived from the transformer-rectifier 10, 14. However, this power must pass through a protection circuit PC. PC includes a gated power supply that is turned on only if battery voltage and polarity are proper. The supply is not capable of delivering sufficient current for the SCR2's gate terminal; gate current for SCR2 is obtained directly from the battery itself, but is controlled by the electronic circuitry which, in turn, is inoperative for all conditions other than a properly connected battery. This constitutes a portion of the reverse-polarity and open or short circuit protection which is part of the charger.

In FIGS. 2 and 2a, the integrated circuits identified by the prefix "U" are voltage comparators, such as model LM-339, manufactured by National Semiconductors, Inc. The integrated circuits identified by the prefix "F" are dual D flip-flops, such as model M M 74 C 74 manufactured by National Semiconductors, Inc. Diodes, capacitors and resistors are identified by the prefixes "D", "C" and "R", respectively. Transistors are identified by the prefix "Q".

Detailed Circuit Description

Charging Current Path

Step-down transformer 10 and rectifier diodes D1-D2 are shown in the upper left hand corner of FIG. 2. Transformer 10 includes a primary 8 and a secondary 9. When the diodes are conducting, a high current flows through the diodes and secondary 9 of transformer 10. If this current is interrupted, as can happen when connections to the battery 16 are poor, the induced potential across transformer 10 could destroy diodes D1-D2.

Capacitors C1-C2 across the diodes serve to tune the transformer secondary to a low resonant frequency such that the induced voltage, with a loose battery connection, is low enough to be safe for the diodes.

The transformer secondary and the diodes comprise a full wave rectifier 14, which is directly connected to the SCR2 anode (FIG. 2). The connection is made through a heat sink to which these components are mounted, since the diode cathodes and SCR2 anode are connected with standard mounting studs (not shown). This yields a good thermal contact and eliminates the need for additional high current interconnections between these components. The heat sink is, as usual, electrically isolated from the case (not shown) of the charging unit, and the case is grounded. Charging current flows through SCR2 (when it is made conductive) battery 16, circuit breaker CB2, ammeter shunt 22, transformer secondary 9 and diodes D1 and D2. Connection to the battery is made through cables 3 and 4. This is the complete battery charging current path.

Protection Circuit PC (Gated Power Supply)

The rectifier output, indicated as +Rect in FIG. 2, is in the form of a half-sinusoid occurring at twice the AC line 12 input frequency.

This waveform is applied to the emitter circuit of transistor Q1 but is slightly reduced in amplitude by the potential divider formed by resistors R2-R3. The entire waveform is also applied to the base circuit of transistor Q1 through resistors R1 and R28. Thus, the base-emitter junction of Q1 is reverse-biased, thereby insuring collector current cut-off of the device even in a high electromagnetic noise environment. The amount of the reverse bias, however, will not damage Q1.

Collector current will flow from Q1 when its base is made less positive than its emitter; this is accomplished by the conduction of transistor Q2. When battery 16 is properly connected between the +BAT 15 and −BAT 17 output terminals, base current will be supplied to transistor Q2 through resistor R13 (upper right side in FIG. 2). Q2 is made conductive, causing Q1 to turn on, and a substantial portion of the half-sinusoid waveform at the emitter of Q1 also appears at the collector of Q1.

If the battery is reverse-polarity connected, the base-emitter junction of Q2 will be reverse-biased by the potential across diode D12. This insures collector current cut-off of Q2 and therefore Q1, even in a high electromagnetic noise environment.

When the half-sinusoid waveform appears at the collector of Q1, current passes through diode D6 and charges capacitor C8 to the peak of this waveform, minus the impedance drop across diode D6. A DC voltage 24 indicated as $+9.5$ V in FIG. 2 appears across capacitor C8. This voltage is not fixed in amplitude but varies with the line voltage from which it has been indirectly derived. Its function will be discussed subsequently.

The half-sinusoid waveform from the collector of Q1 is also supplied to a zener diode D10 through diode D9 and resistors R29, R30. D9 serves to compensate D10 for temperature changes. A somewhat rectangular waveform appears at the anode of diode D9, having a nearly flat top, and sloping sides corresponding to the sloping sides of the half-sinusoid from which it was derived. The voltage having this wave is then applied to diode D11 and serves to charge capacitor C10 to its peak amplitude, minus the impedance drop across diode D11. Node N, attached to capacitor C10, serves as a gated power supply 19, having an output of approximately $+7$ volts. The exact voltage is not critical, and is dependent upon the voltage of zener diode D10.

Power supply 19 is employed for other circuitry within the charger. The power supply will be operative only if the charger is energized and its output leads are correctly connected to a battery. This charger will not operate if the $+7$ volts from the gated power supply 19 is not present.

Pulse Generator PG

When Q1 is turned on by Q2, a portion of the half-sinusoid from the collector of Q1 is applied through resistor R21 to capacitor C9. During each half-sinusoid, a waveform approximately in the shape of a sawtooth appears at capacitor C9. Near the end of each half-sinusoid, C9 discharges through diode D7 and resistor R26 in preparation for the next half-sinusoid. A sawtooth waveform is thus produced across C9 for each half-sinusoid.

The sawtooth waveform appears at the (+) or non-inverting input of a comparator U1 within pulse generator PG (FIG. 2). A DC potential, derived from the $+7$ volt power supply 19, is applied to the (−) or inverting pin of U1. Near the start of each half-sinusoid, the output of U1 is therefore low because U1 is a voltage comparator. As the half-sinusoid progresses, the sawtooth at the (+) input of U1 gradually rises in amplitude; when it equals or exceeds the DC voltage at the (−) input, the output of U1 quickly becomes high. This high-going output is then utilized to supply gate current to SCR2.

Thus, U1 initiates the supply of gate current to SCR2 at a selected time or conduction angle within each half-sinusoid. U1 accomplishes this purpose by generating phasing pulses which vary in phase with respect to the half-sinusoid DC waveform. If the DC bias potential at the (−) input of U1 is low, then the gradually rising sawtooth at the (+) input will cause a high-going transition at the output to occur early in the half-sinusoid period. SCR2 will be turned on early in its conduction angle, and the battery charging current indicated by the ammeter will be high. Conversely, if the bias potential at the (−) input of U1 is high, the sawtooth requires more time to attain an amplitude such that the high-going transition occurs; SCR2 is turned on later in each half sinusoid period, and a reduced current will be indicated.

The magnitude of the DC bias potential at the (−) input of U1 thus controls the amount of current delivered to battery 16. U1 is not capable of delivering sufficient gate current to SCR2, which requires a major fraction of an ampere for satisfactory performance. Further, the gate terminal of SCR2 must be made more positive with respect to its cathode for the device to be turned on; both are maintained at the battery potential by resistor R5. The manner in which the potential at the gate terminal is caused to exceed that of the battery, from which gate current is obtained, will be discussed subsequently.

Current Comparator CC

The DC bias potential at the (−) input of U1 is varied by current comparator CC in order to step from one level of charging current to another level and is held constant between the time the current is stepped from one level to another. This bias potential is derived and controlled in the following manner. A minimum DC bias is applied to the (−) input of U1 by the voltage divider resistors R23 and R75 (near U1), operating between zero volts (OV) and the nominal $+7$ volt supply 19. Negative-going voltage pulses indicative of charging battery current are obtained from node RS of ammeter shunt 22, which passes the battery current. These pulses are applied through node RS to a two section R-C filter consisting of resistors R71, R72 and capacitors C20, C21, as shown in the lower right portion of FIG. 2a. A two section R-C filter is employed because it yields amplitude as well as width information contained in the pulses. After filtering, the resulting negative DC voltage is applied to the (−) input of a voltage comparator U4, along with a small positive DC voltage from the $+7$ volt supply 19 through resistors R68 and R69. The resultant potential at the (−) input of U4 is always positive, but becomes less so if the charging current attempts to increase, or more so if the charging current attempts to decrease.

A positive potential is also applied to the (+) input of comparator U4, and is obtained from the $\overline{Q}$ output of a boost flip-flop F8 through resistor R61 and potentiometer R62 (FIG. 2a). $\overline{Q}$ of U8 provides a reference voltage for comparator U4. U4 now operates with both input terminals biased with a positive DC potential. If the battery charging current attempts to increase, the positive potential at the (−) input of U4 decreases, and the output of U4 is switched to a high voltage state. This voltage is applied to diode D26 and the filter components C22-R74-C23. The high voltage is added to the minimum DC bias potential applied to the (−) input of U1. With the increased voltage at the (−) input of U1, the sawtooth at the (+) input now becomes greater in amplitude in order to initiate a gate current pulse to SCR2. The sawtooth will become greater in amplitude as the half-sinusoid progresses and SCR2 is turned on later. The charging current is then prevented from rising.

Similarly, if the battery charging current attempts to decrease, the output of U4 is switched to a low voltage state, and the filtered positive output of U4 also decreases. The reduced bias applied to the (−) input of U1 will then permit a gate current pulse to be generated at a lower level of the sawtooth which is at the (+) input of U1. SCR2 is then turned on earlier in the half-sinusoid period and again the battery charging current remains essentially unchanged.

Thus, U4 and the other components of circuit CC serve as a current regulator. Circuit CC maintains a nearly constant charging current within each current level irrespective of ordinary line fluctuations, different battery sizes, or any other cause which may effect the charging current level. The level of current at which U4 will regulate is determined by the positive DC bias appied to its (+) or (−) input, or both. This bias can be altered in any of three ways:

1. R62 Adjustment

One is the initial adjustment of R62, which is a printed circuit board mounted potentiometer; the adjustment is made at the factory and is not intended to be available to the user.

2. Boost Start

The second bias adjustment is made when a Boost push-button 28 at the control panel 26 is depressed in order to close switch S5 (FIG. 2a). Button 28 controls a boost circuit BS (FIG. 2a). In the first high current stage, depressing push button 28 and closing S5 will cause the Preset (P) terminal of flip-flop F8 to momentarily become low; $\overline{Q}$ of F8 will also become low and remain low even after S5 is released. The positive bias at the (+) input of U4 becomes near zero, but the bias at the (−) input remains positive regardless of the current level. With this arrangement, the output of U4 falls to a low voltage state near zero, and remains near zero.

A small portion of a line-derived DC voltage is also applied to the (−) input of U1 by resistor R27, from the collector terminal of transistor Q1 to the junction of resistors R23-R75. This serves as an additional means of current regulation for changes in line voltage. The resistance value selected for R27 is such that a slight overcompensation results. That is, an increase in line voltage will cause a small decrease in current, and vice-versa.

The positive potential which now appears at the (−) input of U1 is the minimum bias derived from the divider resistors R23-R75. It also appears at the cathode of diode D26 (FIG. 2a) which becomes reverse-biased and prevents U4 from any interference with the current level.

The charger can now deliver a current which is load dependent and can be greatly in excess of its intended capacity. However, this current cannot be greater than that established by the minimum bias applied to the (−) input of U1. It can deliver this current until either a hermetically sealed, thermally operated circuit breaker 49 (CB2) connected in series with the battery terminal 17 operates, or circuit breaker 50 (CB1) in the primary of the transformer 10 opens, or until the battery voltage rises sufficiently to cause a current step-down. When either circuit breaker CB1 or CB2 is reset, the charger is again reactivated. But the $\overline{Q}$ of F8 will always be in its high voltage state whenever the charger is activated, and current regulation is restored. If Boost capability is still desired, Boost start button 28 must be operated and the contacts of S5 must again be closed.

Current regulation is the charger's preferred mode of operation. If the operator depresses the Boost button 28 so as to obtain a high current during normal charging, the charger will eventually either turn itself off or return to its preferred current regulating mode. As stated, CB is a thermally operated circuit breaker and will re-set itself after some time. The charger will then automatically return to its preferred current regulating mode.

3. Current Stepping

The third bias adjustment yields a regulated current at each of three or four different charging current levels which are created in sequential steps. The bias adjustment appears at the (+) input of U4 as a series of bias levels. Each bias level controls an analogous battery charging current level. At each bias level, the battery charging current will become reduced but will continue to be regulated, because of the shunt derived bias at the (−) input of U4.

Figure 4:
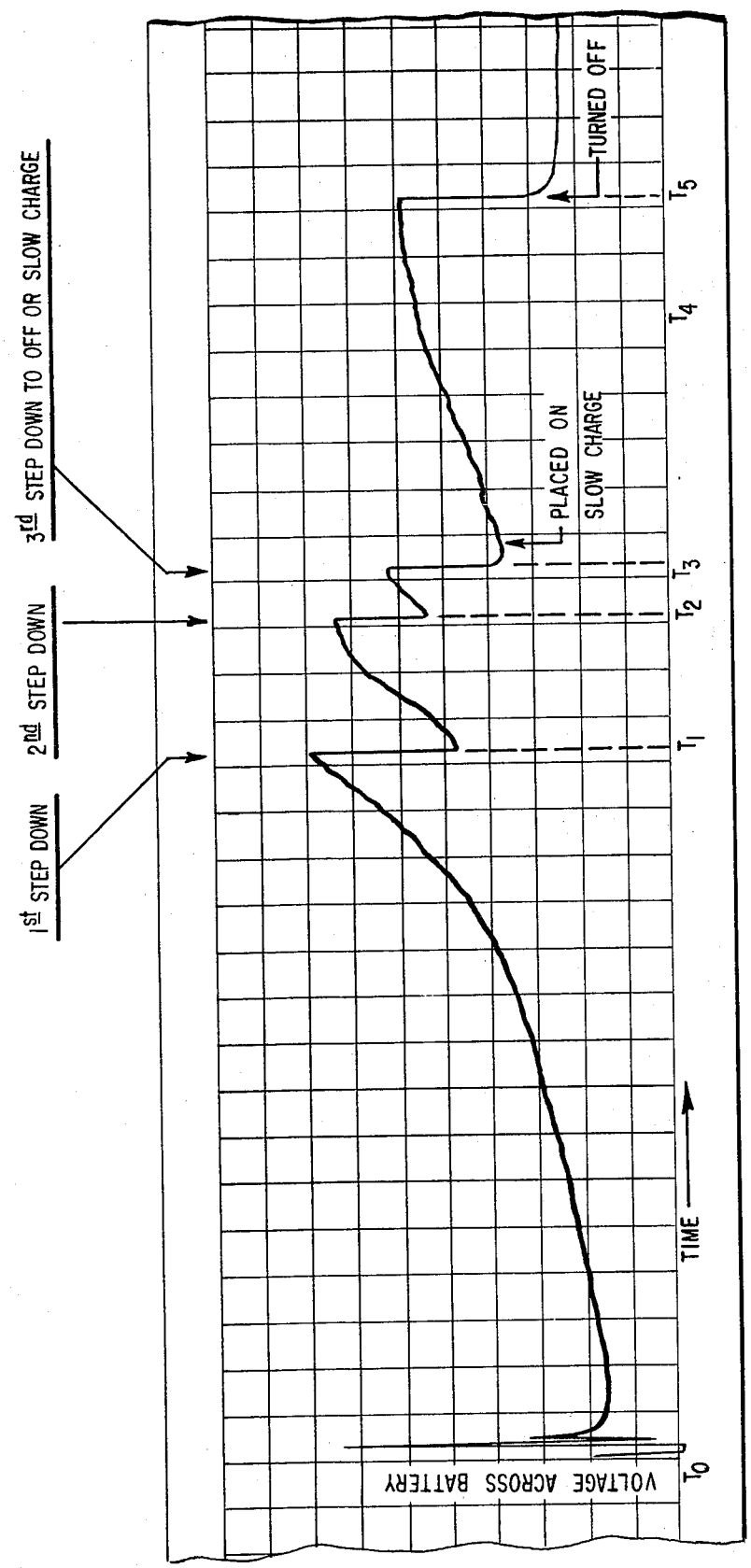
FIG. 4 is a graph showing the voltage across an exemplary battery during a four-step charging method carried out in accordance with the invention.

The manner in which the battery charging current is stepped through various levels is best described by means of example. When a conventional 12 volt automobile lead-acid battery is charged, the charging current is maintained at a first level of about 40 amperes until the battery voltage increases to a first threshold of about 14.6 volts. Referring to FIG. 4, if the charging is started at time T0, the first threshold voltage is reached at time T1, about one hour later. The charging current then is reduced to a second level of about 20 amperes (thereby reducing the battery voltage) and the charging continues until the battery voltage increases to a second threshold of about 14.4 volts at time T2. The battery current then is reduced to a third level of about 10 amperes (thereby reducing the battery voltage) and the charging continues until the battery voltage increases to a third threshold of about 14.05 at time T3. The battery current then is turned off (reduced to a zero value), or is placed on a slow charge as shown in FIG. 4. For the slow charge option, charging continues. At time T4, the battery reaches a fourth threshold voltage and light 36 begins to flash. The operator turns off the charger at time T5.

In the preferred embodiment, the battery voltage condition used to step down the charging current is voltage amplitude. However, as shown in FIG. 4, battery voltage rate of increase or slope also could be used to step down charging current.

The manner in which the bias levels at the (+) input of U4 controls the stepping of the battery charging current is now described. A new step of current is required each time the voltage of battery 16 rises to a prescribed threshold. A portion of the battery voltage is applied to the (+) input of a comparator U2 (lower left in FIG. 2). The entire battery voltage cannot be employed because it exceeds the nominal +7 volts provided by supply 19 to comparators U1–U5 and U10. These comparators must be operated with input potentials less than their supply potential.

The battery voltage is applied to a resistive voltage divider 29 through switch S2B (left top in FIG. 2a). A portion of the voltage from the divider is then applied to the (+) input of battery voltage sense comparator U2. A reference bias is applied to the (−) input of U2 by means of resistors R41-R42-R43. The output of U2 is normally in a low voltage state. When the battery voltage sensed at the (+) input of U2 equals or exceeds the reference votage at the (−) input, the output of U2 is switched to a high voltage state. The need for a current step decrease is now indicated.

The high-going transition from the output of U2 is applied to the Clock (C) inputs of a sequencing circuit SC comprising sequencing flip-flops F5, F6 and F7, which are connected as a shift register. All Q outputs of F5-F7 are initially in a low voltage state and the $\overline{Q}$ outputs are initially in a high voltage state. Under these conditions, the bias voltages on the inputs of comparator U4 are set to establish and maintain the first level of battery charging current (e.g., about 40 amperes). In addition, the initial states of the $\overline{Q}$ outputs of F5-F7 set the bias voltages on the inputs of comparator U2 so that the output of U2 is switched to its high voltage state when the battery voltage increases to the first threshold voltage (e.g., 14.6 volts). The high voltage state of Q of F5 is transferred through D17-R48-R65 to the junction of R63 and R64 in the (+) input circuit of comparator U4. This occurs when the output of comparator U3 is high. The function of U3 will be discussed subsequently.

When Q of F5 is switched high, $\overline{Q}$ of F5 is switched low. The low $\overline{Q}$ voltage is transferred to the (−) input circuit of comparator U4 by means of D18 and R50. The altered bias potential difference at its two inputs appear to U4 as excessive current flowing into the battery. U4 now responds by reducing the battery charging current, in the manner described earlier, until a predetermined potential difference between its (+) and (−) inputs is re-established.

In the present example, the predetermined potential diffrence is re-established. When the battery charging current is reduced to the second level (e.g., 20 amperes), U4 will respond by changing the battery charging current level until the potential difference between the two inputs is re-established.

The output of U2 is switched to a low voltage state because the battery voltage decreases as the charging current is stepped to the second level. The low voltage $\overline{Q}$ output of F5 also causes the reference bias at the (−) input of U2 to decrease, because the voltage at the junction of resistors R41-R42 has been made lower by the connection of resistor R49 to $\overline{Q}$ of F5. This means that the battery voltage rises only to the second threshold voltage (e.g., 14.4 volts) in order to initiate the next current step (i.e., the step to the third current level).

Charging of the battery continues at the second current level until the battery continues at the second current level until the battery voltage rises to the second threshold voltage. The output of U2 then is switched to its high voltage state. Again, the high-going transistion is applied to the C (Clock) inputs of F5-F6-F7; F5 cannot change its state because of the interconnections between F5-F7. The Q and $\overline{Q}$ outputs of F5 remain high and low respectively. Only F6 responds by switching its Q and $\overline{Q}$ outputs to high and low voltage states, respectively. The switching of F6 alters the (+) and (−) input bias of comparator U4, which responds by reducing the battery charging current to the third level (e.g., 10 amperes) that re-establishes the potential difference between its (+) and (−) inputs.

The reference voltage at the (−) input of comparator U2 is decreased by transmitting the low voltage at the $\overline{Q}$ output of F6 through R52 to the junction of resistors R41-R42. The third threshold battery voltage now required for the next current step (e.g., 14.05 volts) is lower than either of the first or second threshold voltages. The output of U2 again is switched to a low voltage state because the battery voltage falls as the current is reduced to the third level.

Charging of the battery continues at the third current level until the battery voltage rises to the third voltage threshold level. The output of U2 again is switched high and the Q and $\overline{Q}$ outputs of F7 thereby are switched to their high and low voltage states, respectively. The Q and $\overline{Q}$ outputs of F5 and F6 remain in their high and low voltage states, respectively. The bias potentials at the (+) and (−) inputs of U4 are again altered, by means of D21-R54 and D23-R56 from F7. U4 is now capable of regulating at a low current level. Whether U4 regulates at a low current level or the charger turns itself "off" depends upon the position of two pole Charger Selector switch S4. The position of S4 is dependent on the operator's movement of rotatable knob 30 on control panel 26 (FIG. 1).

If knob 30 and switch S4 are in the Maint. Free (maintenance-free) or conventional position (FIG. 2), the voltage generated at the low $\overline{Q}$ of F7 will be transferred through S4B to the cathode of diode D8. A positive going sawtooth is present at the (+) input of U1 and therefore appears at the anode of D8. Since the cathode of diode D8 is biased (by $\overline{Q}$ of F7), the sawtooth is disabled (i.e., shorted out by D8), and the output of U1 is switched to a low voltage. As a result, current pulses for gate switching SCR2 cease.

Since no gate current pulses are supplied to SCR2, no current can flow into the battery regardless of the efforts of U4 to maintain any current level. The charger has turned itself off. It has completed its three current steps.

The high voltage at the Q output of F7 is applied to the base circuit of the gated power supply transistor Q2, through diode D13 and resistor R33. The gated power supply will then remain energized even when the charger output leads are disconnected from the battery. F5, F6, F7 are not permitted to revert to their original state; Qs remain high and $\overline{Q}$s remain low, and the charger will remain off. Thus sparking does not occur when the output clips are disconnected from one battery and connected to another. It can, however, be re-energized by some means such as cycling the flow of primary power. If the output leads are now reverse-polarity connected to a battery, the gated power supply quickly becomes disabled and the charger will refuse to operate.

Slow Finishing Charge

If an additional "finish" charge is desired, knob 30 and switch S4 can be placed in the "Slow" position. In this position, a small trickle current will be delivered to the battery 16 for as long as the charger is in operation (see FIG. 4). Since the trickle current is regulated, it will not disappear when the input line voltage falls, nor will it become excessively high with a modest increase in line voltage.

The trickle current will not taper downward toward zero as the battery approaches a "full" charge. This downward taper has been used in the past as an indication that a full charge is being approached. This type of indication is no longer provided because of current regulation. If the Slow finish charge is continued long enough, the battery could become damaged even though the current is low. Thus, an indication that a full charge is being approached is provided.

As the trickle charge is applied to the battery, the battery voltage will continue to rise. When it attains a prescribed level (e.g., time T4 in FIG. 4), the output of U2 will periodically switch between high and low voltages because of the changing bias at its (−) input; U2 has thus become a low frequency pulse generator.

The alternately high and low output of U2 is applied to the base circuit of transistor Q4 (upper right in FIG. 2a) through diode D29 and resistor R88. Transistors Q4 and Q5 drive diode D30, a light-emitting diode (LED) at the control panel which is visible through window 36. As long as U2 operates as a pulse generator, D30 is flashed on and off. When the flashing is observed, the operator is advised to turn off the unit and remove the battery.

The flashing of D30 begins at a battery threshold voltage indicating that the battery is charged to approximately 90% of its capacity. The threshold voltage is set by the value of R55, which is connected to the Q output of F7.

The Slow charge capability is obtained when charge selector switch S4A is placed in its mid-position, as shown in FIG. 2. This causes all Preset (P) terminals of the flip-flops F5-F7 to switch to a low voltage and remain so. The Q and $\overline{Q}$ outputs of F5-F7 then are switched to their high and low voltage states, respectively. This is the bias condition presented to U4 for regulation at the trickle current level. However the Clear (CLR) terminal of the Boost flip-flop F8 is maintained at a low voltage by means of diode D24. The Q of output F8 remains high (or is forced high if it had been low, as when Boost was used), thus providing a reference voltage for the comparator U4. In the Slow finish position, then, the Boost capability is neither desirable nor possible to obtain. This is to protect rectifier diodes D1-D2 and SCR2 from high peak currents at the small conduction angle. At the small conduction angle, sufficient Boost current would not be obtained anyway.

Similarly, the Q output of F5 must be low to obtain the Boost; that is, the charger must be in the first high current stage, when the SCR2 conduction angle during the half-sinusoid intervals is large. In any succeeding current stage, the Q output of F5 becomes high, and the Boost capability is denied. This is accomplished by not permitting the Boost Start button 28 to cause the P terminal of F8 to be switched to a low voltage.

Charge Selector

Selector switch S4 and knob 30 need not be in any particular position when the charger is placed in operation. Thus, if S4 and knob 30 are in the Slow position, the trickle charge will be obtained immediately, without current stepping. If S4 and knob 30 are moved to either the Maint. Free or Conventional position, capacitors C14 and C15 momentarily depress the voltage applied to the F5-F7 CLR terminals, and the charger is placed in its automatic mode, beginning with its first high current level. The selector switch S4 can be manipulated at any time and the charger will perform as indicated at the control panel. In the Maint. Free position, resistor R19 in the voltage divider 29 (top left, FIG. 2a), is shunted across R15 by S4A. The battery must now charge to a somewhat higher potential than in the Conv. position for current stepping to occur, as required for maintenance-free batteries.

As previously explained, a typical 12 volt automobile battery preferably is charged in three steps at current levels of 40 amperes, 20 amperes, and 10 amperes. Experience has shown that a six volt battery preferably is charged in three steps having ratios of current levels different from 40:20:10. For 6 volt batteries, the preferred ratio is 65:35:20. The ability of the charger to handle both 6 and 12 volt batteries is due to a compensator circuit COM (FIG. 2a).

It is the purpose of battery compensator comparator U3 to establish a different step current ratio, rather than a fixed step current ratio, for 6 and 12 volt batteries. This is accomplished in the following manner.

A fixed bias is presented to the (+) input of U3, from the nominal +7 volt supply 19. A knob 32 which operates switch S2B between terminals 6 V and 12 V is mounted on panel 26. If a 12 volt battery is connected to the charger and switch S2B is in contact with terminal 12 V, the bias voltage at the (−) input U3 is always greater than the bias voltage at its (+) input, and the output of U3 is switched to a low voltage state. If a 6 volt battery is connected to the charger and switch S2B is in contact with terminal 6 V, the bias voltage at the (−) input of U3 will always be less than the bias voltage at the (+) input, and the output of U3 is switched to a high voltage state. These output conditions of U3 are true even for substantial variations in voltage of any one battery.

Assuming switch S2B is positioned properly, a low voltage output from U3 indicates that the charger is operating with a 12 volt battery, and a high voltage output indicates that it is operating with a 6 volt battery.

With a 12 bolt battery, if the $\overline{Q}$ outputs of F5-F7 attempt to switch to a high voltage, they will be short-circuited to the low voltage output of U3 through diode D15. The step current levels are then set only by the bias at the (−) input of U4 from the $\overline{Q}$ outputs of F5-F7 by means of R50-R53-R56 and their associated diodes D18-D20-D23.

With a 6 volt battery, the $\overline{Q}$ outputs of F5-F7 are utilized as before, but the high voltage output of U3 reverse-biases diode D15; the Q outputs of F5-F7 (through R48, R51, R54 and their associated diodes D17-D19-D21) are allowed to bias U4 in order to regulate three different current steps. Step currents can therefore be set at different ratios for the two different battery voltages.

Alternatively, different ratios for 6 and 12 volt batteries could be accomplished by means of a third pole (not shown) added to the two pole switch S2A, S2B.

SCR2 Gate Current (GC)

It has been explained that a high-going voltage output from pulse generator U1 initiates the flow of gate current into SCR2. U1 by itself is unable to provide the quantity of gate current demanded by SCR2. Instead, pulse generator U1 turns on a gate current circuit GC which includes switch SCR1, capacitor C4 and resistor R7 (FIG. 2). SCR1 permits a large current to flow into the gate terminal of SCR2, thereby turning on SCR2 and enabling current to flow into the battery.

SCR2 can only be turned on when its gate voltage is positive with respect to its cathode. But resistor R5 normally maintains both the gate and cathode of SCR2 at the same potential, which is the battery voltage. The gate voltage is made positive relative to the cathode in the maner illustrated in the equivalent circuit of FIG. 3.

Figure 3:
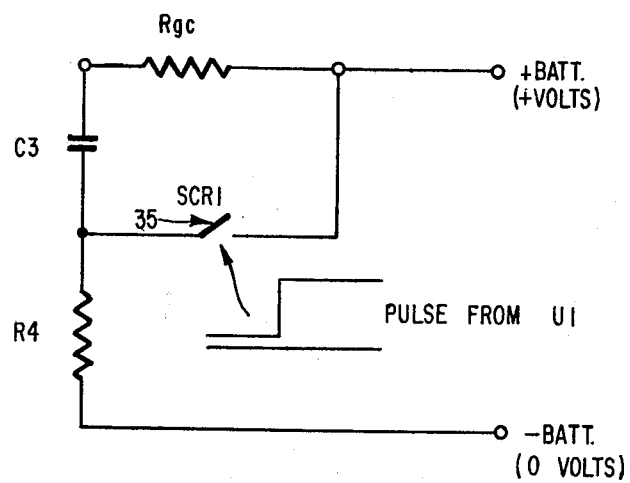

In FIG. 3, the gate-cathode junction of SCR2 in parallel with R5 is lumped together and shown simply as Rgc. The gate driver switch is SCR1 which is in the open position and numbered 35. With the battery connected as shown, the capacitor C3 will charge through Rgc and R4; the top plate will eventually become (+), and the bottom plate will become near (0). At the instant of switch (SCR1) closure, the bottom plate becomes (+), since it is now connected directly to the battery.

But it is known that the voltage across a capacitor cannot change instantaneously. If the bottom plate which was at (0) volts becomes (+), then the top plate, which was (+), must now become (++). The voltage across Rgc is now (++) at its left end, and (+) at its right end, FIG. 3.

Since the left end of Rgc is also the gate terminal of SCR2, the gate is made more positive than the cathode by a voltage equal to the battery voltage, and the device turns on. It will remain on until the descending portion of the half-sinusoid at its anode approaches the battery voltage and SCR2 is brought into its minimum holding current region. Beyond this, SCR2 is reverse-biased, thus assuring turn-off within each half-sinusoid period.

Deriving gate current in this manner provides further protection against output lead short-circuits or reverse polarity connections.

Low Voltage Start

The battery itself is used to supply gate current to SCR2 because it is capable of doing so, even if its state of charge is very low. This further enhances the charger's refusal to operate with reversed or open connections. However, if the open circuit battery voltage falls to 3-5 volts, as has been observed with an extremely low state of charge, gate current delivered to SCR2 will be insufficient, and the charger will not operate. It can be made operative by supplying the SCR2 gate with a voltage higher than that of the battery for a short time; once charging starts it will become self-sustaining and the supplied voltage can be removed. This is accomplished in the following manner by low voltage starting circuit LV.

Referring again to FIG. 2, transistor Q3 is shown in the SCR1 anode circuit with diode D4. The emitter of Q3 is supplied with a potential of approximately +9.5 volts DC by conductor 63. A high current can thus be obtained from C8, suitable for the SCR2 gate, but for a short time only.

Q3 is normally off, since its base and emitter are at the same potential. Closing S3, by operating push button 38 on panel 26, will cause the base of Q3 to be biased near zero volts with respect to the emitter, and Q3 can conduct current heavily. When SCR1 is turned on by U1, a substantial portion of the +9.5 volts at the collector of Q3 becomes available for gate current for SCR2, and the charger becomes operative. Battery voltage rises quickly and S3 can be released. Charging continues in a self-sustaining manner.

In order to preserve the charger's refusal to operate with reversed or open battery connections, a minimum voltage of correct polarity is required of the battery 16 for turning on Q2 and therefore Q1, from which the starting voltage of +9.5 volts is derived. This minimum battery voltage is just under 1.5 volts. It has been found that a battery having less than 1.5 volts has been irreversibly damaged, and its condition will not be greatly improved by charging.

Depressing button 38 and closing S3 will not start the charger when the connections are open or reversed, even if this pushbutton 38 is held down indefinitely, because the nominal +9.5 volt supply is not generated under these conditions.

Diode D4 protects Q3 from reverse collector-emitter bias when the battery voltage is greater than the Q3 emitter voltage. D3 prevents the starting voltage at the collector of Q3 from being routed to and becoming short-circuited by the battery when its voltage is low.

Battery Test

A sulphated battery condition can be caused by allowing a battery in a low state of charge to remain idle, without charging for a protracted length of time. The sulphuric acid reacts with the lead plates of the cells causing a deposit of lead sulphate to form on the plates. Lead sulphate is not soluble in sulphuric acid and acts as an electrical insulator. A portion of the lead plates to which this lead sulphate adheres is thus rendered useless and is of no further service. A high degree of sulphation is irreversible and the battery is best discarded. Charging such a battery would be wasteful of time and effort.

This sulphated condition can be ascertained by passing a high charging current through the battery for a known length of time, usually three minutes, and observing the voltage near the end of the time interval. If the voltage rises to or above a prescribed level, the battery is assumed to be sulphated. This voltage level is higher than any of the voltage levels required by the charger for stepping down its current. If the charger described here is to be used for this purpose, its current stepping type of performance must then be defeated.

But defeating the current stepping invites operator error and misjudgment. A battery known to be in good condition could be made useless if the charger's high current is maintained for a long time without stepping down. The battery could even be caused to explode, as has been known to happen.

The charger's current stepping can be defeated for test purposes, but only for a short period of time, nominally three minutes. After the time interval elapses, the charger reverts to its automatic stepping type of performance without regard to the operator's wishes.

This time interval is provided by an electronic timing circuit TC which includes U9 and U10 shown in the upper right hand portion of FIG. 2a. The circuit of U9 operates as a monostable multivibrator; the output of U9 is normally low. When the (−) input of U9 is momentarily made low, its output becomes high and the time is activated. The time interval during which it will remain activated is determined by the DC bias at both input terminals of U9, and the time constant of R81 and C26. The preferred interval is three minutes; however, it can be made slightly longer than three minutes in order to conserve on the cost of an additional adjustment potentiometer.

The high voltage output of U9 is applied to transistors Q4-Q5, thus causing LED 30 to emit light. The glowing of LED 30 indicates that the timer is operating.

When the output of U9 is switched high, the output of U10 is switched low. The low output voltage on U10 is applied to diode D25 (near F8) and the $\overline{\text{CLR}}$ terminals of F5-F8 are then maintained at a low voltage. All Q and $\overline{\text{Q}}$ outputs of F5-F8 will remain in their low and high voltage states, respectively. This is the bias condition created by F5-F8 for current regulation at the first level of battery charging current. If desired, this current can be made somewhat less than the first level of current by means of resistor R70. If the two currents are to be equal, however, R70 is deleted, that is, left open.

The Boost capability is denied during the timer interval because current regulation must be maintained. The $\overline{\text{CLR}}$ terminal of F8 is also held low by the timer through D25. The $\overline{\text{Q}}$ output of F8 is high and provides the reference for the current regulator comparator U4. If Boost is in use when the timer is activated, it is interrupted by the timer so that current regulation is restored.

The timer can be disabled before completing its interval if the operator is undecided as to which charger capability is desired. Moving the Charge Selector knob 30 and switch S4 to the "Slow" position will cause D16, through S4A, to restore the low output from U9, thus interrupting the interval. When so interrupted, the timer will be capable of starting from zero, that is, no unexpired time remains within it. Thus, the timer will provide its full three minute interval whenever it is activated regardless of its prior history. This interval is not provided when the switch S4 is in the Slow position.

Battery Initial Voltage Fluctuation

If the battery state of charge is so low that the Low Battery start button 38 must be depressed to start charging, then very likely the battery voltage will rise and fall many times before settling to some level, usually in less than a minute. This has often been observed.

Since these initial voltage fluctuations at their high peaks are greater than the voltages required for current stepping, the charger will tend to quickly turn itself off. This is not desired, because the battery still requires charging.

When the timer is activated by depressing the Low Battery start button 38 (through diode D27), current stepping is withheld for the three minute interval regardless of battery voltage. The battery voltage will have settled to some level well before this interval is ended. When the time interval expires, the charger reverts to its current stepping capability and normal charging is continued. Current will be stepped down according to the battery's needs.

A power "on" light 31 is mounted on control panel 26. A "power off-on" knob 34 is also provided on panel 26 to operate 110 volt switch S1 (FIG. 2).

In the automatic mode, the unit will always start at its first level. But if it is placed in operation with a well-charged battery, it will step itself down and finally off in less than a minute. Over-charging a battery is thus all but impossible.

From the foregoing, it will be apparent that an improved automatic battery charger and battery charger method has been provided which is capable of automatically charging both conventional and maintenance free batteries of different voltages.

What is claimed is:

1. An automatic battery charger for charging a storage battery capable of conducting a battery charging current and generating a battery voltage, said charger comprising:
    battery cable means for connecting the battery to the charger;
    current control means operable in a first mode for conducting through the cable means a charging current regulated at a first predetermined level, and operable in a second mode for conducting through the cable means a charging current regulated at a second predetermined level less than the first predetermined level;
    voltage monitor means operable in a first mode for generating a first monitor signal in response to a first battery voltage condition, and operable in a second mode for generating a second monitor signal in response to a second battery voltage condition less than the first battery voltage condition; and
    sequencing means for operating the current control means and voltage monitor means in their first modes, for operating the current control means and voltage monitor means in their second modes in response to the first monitor signal, and for enabling the current control means to reduce the charging current in response to the second monitor signal, whereby the battery is automatically charged at a rapid yet safe rate.

2. A charger, as claimed in claim 1, wherein the current control means is operable in an initial mode for conducting through the cable means a charging current regulated at an initial predetermined level greater than the first predetermined level, wherein the voltage monitor means is operable in an initial mode for generating an initial monitor signal in response to an initial battery voltage condition greater than the first battery voltage condition, and wherein the sequencing means comprises means for initially operating the current control means and voltage monitor means in their initial modes, and for operating the current control means and voltage monitor means in their first modes in response to the initial monitor signal.

3. A charger, as claimed in claim 1 or 2, wherein the sequencing means comprises means for enabling the current control means to reduce the charging current to substantially zero in response to the second monitor signal.

4. A charger, as claimed in claim 1 or 2, wherein the sequencing means comprises means for enabling the current control means to reduce the charging current to a trickle current in response to the second monitor signal.

5. A charger, as claimed in claim 4, wherein the voltage monitor means is operable in a third mode for generating a third monitor signal in response to a third battery voltage condition lower than the second battery voltage condition and further comprising indicator means for indicating the existence of the third monitor signal to an operator, whereby the charged state of the battery is detectable.

6. A charger, as claimed in claim 1, and further comprising protection means for disabling the current control means if the battery is connected to the cable means with predetermined polarity or is disconnected from the cable means.

7. A charger, as claimed in claim 6, wherein the protection means comprises a gated power supply.

8. A charger, as claimed in claim 2, and further comprising boost means for operating the current control means in the initial mode so that the initial level of charging current is unregulated.

9. A charger, as claimed in claim 1, and further comprising compensator means for varying the ratio of the first and second levels of charging current, so that the charging of batteries of different voltage ratings and capacities can be optimized.

10. A charger, as claimed in claim 2 and further comprising timing means for continuing the operation of the current control means in the initial mode for a predetermined time period irrespective of battery voltage, whereby a battery can be checked for a sulphated condition.

11. A charger, as claimed in claim 10, wherein the timing means comprises means for inhibiting the sequencing means.

12. A charger, as claimed in claim 10, wherein the predetermined time period is less than four minutes.

13. A charger, as claimed in claim 10, wherein the timing means activates an indicator means for indicating the operation of the timing means.

14. A charger, as claimed in claim 2, wherein the current control means comprises:
- a source of fluctuating dc current, occurring in cycles;
- an electronic switch including a control gate capable of enabling the conduction of current during an adjustable portion of said cycles in response to firing pulses;
- gating means for supplying firing pulses from current supplied by the battery in response to phasing pulses;
- pulse generator means for supplying phasing pulses to the gating means;
- current comparator means for altering the phase of the phasing pulses relative to the dc fluctuating current depending on the amount of charging current, whereby the charging current is regulated.

15. A charger, as claimed in claim 14, wherein the electronic switch is a controlled rectifier.

16. A charger, as claimed in claim 14, and further comprising starting means for furnishing current to the pulse generator means from the source in the event that the battery is incapable of supplying sufficient current.

17. A charger, as claimed in claim 16, wherein the starting means further comprises timing means for continuing the operation of the current control means in the initial mode for a predetermined time period irrespective of battery voltage, whereby initial fluctuations in battery voltage do not inhibit continued charging.

18. A charger, as claimed in claims 1 or 14, wherein the voltage monitor means comprises a first voltage comparator including a first input, a second input and an output for generating the monitor signals.

19. A charger, as claimed in claim 18, wherein the current control means comprises:
- a second voltage comparator including a first input, a second input, and an output for enabling the control of the charging current level.

20. A charger, as claimed in claim 19, wherein the sequencing means comprises a ring counter including an input responsive to the monitor signals and counter output means for establishing a plurality of voltages dependent on the state of the ring counter, wherein the second inputs of the first and second voltage comparators are responsive to the counter output means, wherein the first input of the first voltage regulator is responsive to the battery voltage and wherein the first input of the second voltage comparator is responsive to a voltage proportional to the battery charging current.

21. A charger, as claimed in claims 1 or 2 wherein the battery voltage conditions are battery voltage amplitudes.

22. A method of automatically charging a storage battery of the type in which a voltage condition of the battery increases as the charge increases, said method comprising the steps of:
- a. regulating the charging of the battery at a first predetermined level of charging current so that the battery voltage condition increases;
- b. automatically decreasing the regulated charging current supplied to the battery to a second predetermined level less than the first predetermined level in response to the increase of the battery voltage condition to a first predetermined value, whereby the battery voltage condition is decreased;
- c. continuing the charging of the battery at the second predetermined level of regulated charging current, so that the battery voltage condition increases; and
- d. automatically decreasing the regulated charging current supplied to the battery to a third predetermined level less than the second predetermined level in response to the increase of the battery voltage condition to a second predetermined value less than the first predetermined value, whereby the battery is rapidly and safely charged.

23. A method, as claimed in claim 22, wherein the third predetermined level is substantially zero.

24. A method as claimed in claim 22, wherein the third predetermined level enables the trickle charging of said battery.

25. A method as claimed in claim 22, and further comprising the steps of:
- initially charging the battery at an initial level of charging current greater than the first predetermined level;
- automatically decreasing the charging current supplied to the battery to the first predetermined level in response to an increase in the battery voltage condition to an initial value greater than the first predetermined value, whereby the battery voltage condition is decreased; and
- continuing the charging of the battery at the first predetermined level.

26. A method as claimed in claim 22, wherein the step of automatically decreasing the charging current is inhibited for a predetermined time interval, so that the battery can be checked for a sulphated condition.

27. A method, as claimed in claims 22, 23, 24 or 25 wherein the battery voltage conditions are battery voltage amplitude.

28. A charger, as claimed in claim 5, wherein the battery voltage conditions are battery voltage amplitude.

* * * * *